US006754471B1

(12) United States Patent
Vakilian

(10) Patent No.: US 6,754,471 B1
(45) Date of Patent: Jun. 22, 2004

(54) SURFACE ACOUSTIC WAVE FILTER PACKAGING

(75) Inventor: Nooshin D. Vakilian, Irvine, CA (US)

(73) Assignee: Skyworks Solutions, Inc., Newport Beach, CA (US)

( * ) Notice: Subject to any disclaimer, the term of this patent is extended or adjusted under 35 U.S.C. 154(b) by 0 days.

(21) Appl. No.: 09/455,108

(22) Filed: Dec. 6, 1999

(51) Int. Cl.[7] .......................... H04B 1/46; H01L 21/48; H03H 9/64
(52) U.S. Cl. .................... 455/73; 455/307; 455/82; 455/78; 455/575.7; 333/187; 438/108
(58) Field of Search .................... 257/778, 723, 257/724; 438/107, 108; 333/133, 193–196, 187, 118; 455/82, 83, 84, 85, 87, 88, 550.1, 11.1, 95, 575.7, 562.1, 101, 121, 307; 330/126

(56) References Cited

U.S. PATENT DOCUMENTS

| | | | |
|---|---|---|---|
| 5,109,536 A | * 4/1992 | Kommrusch | 455/82 |
| 5,254,962 A | * 10/1993 | Morris et al. | 333/193 |
| 5,319,800 A | * 6/1994 | Erbora et al. | 455/78 |
| 5,355,524 A | * 10/1994 | Higgins, Jr. | 455/82 |
| 5,444,865 A | * 8/1995 | Heck et al. | 455/86 |
| 5,465,409 A | * 11/1995 | Borras et al. | 455/84 |
| 5,903,820 A | * 5/1999 | Hagstrom | 455/82 |
| 5,928,598 A | * 7/1999 | Anderson et al. | 264/446 |
| 6,417,026 B2 | * 7/2002 | Gotoh et al. | 438/108 |
| 6,424,238 B1 | * 7/2002 | Penunuri | 333/187 |

OTHER PUBLICATIONS

Senju Metal Industry Co.,Ltd, SMIC Technical Bulletin—Sparkle Ball for BGA, CSP, Flip Chip Application, Issued Oct., 1997, p. 3, http://www.senjucomtek.com/Sphere_Tech_Bulletin.pdf.*

H. Yatsuda and T. Eimura, "Flip–Chip Assembly Technique for SAW Devices", *ISHM '95 Proceedings*, pp. 003–008.
Shuji Suma, Katsuhiko Gunji, Toshio Tagami and Yoshinobu Sakamoto, "Surface Mount Type SAW Filter For Hand–Held Telephones", *IEEE Ultrasonics Symposium*, 1995, pp. 1–6.
Hiromi Yatsuda, Taira Horishima, Takeshi Eimura and Takao Ooiwa, "Miniaturized SAW Filters Using A Flip–Chip Technique", IEEE Transactions on Ultrasonics, Ferroelectrics, and Frequency Control, vol. 43, No. 1, Jan. 1996, pp. 125–130.

* cited by examiner

*Primary Examiner*—Sinh Tran
*Assistant Examiner*—Kamran Afshar
(74) *Attorney, Agent, or Firm*—Christopher J. Rourk; Akin Gump Strauss Hauer & Feld, LLP

(57) ABSTRACT

A system that provides packaging for a surface acoustic wave filter in such a way that the surface acoustic wave filter is capable of integration with a number of additional electronic devices on an integrated substrate. The surface acoustic wave filter is mounted in a "flip chip" configuration that enables the surface of the surface acoustic wave filter to be protected from a molding compound during and after the encapsulation of the surface acoustic wave filter and other circuitry contained on the integrated substrate. The manner in which the surface acoustic wave filter is packaged provides a great reduction in cost and occupied real estate on the integrated substrate, in that, the surface acoustic wave filter is mounted in such as way as not to require conventionally used ceramic packaging that encases the surface acoustic wave filter. An air gap is preserved between the surface acoustic wave filter side of the surface acoustic wave filter and the integrated substrate on which it is mounted. This air gap ensures proper operation of the surface acoustic wave filter. In addition, a passivation layer is deposited on the surface acoustic wave filter side of the surface acoustic wave filter before it is mounted in the "flip chip" configuration, thereby provided a degree of protection of the surface acoustic wave filter side of the surface acoustic wave filter.

17 Claims, 5 Drawing Sheets

Wireless Transceiver

Detailed View of "Flip Chip" Mounted Circuitry

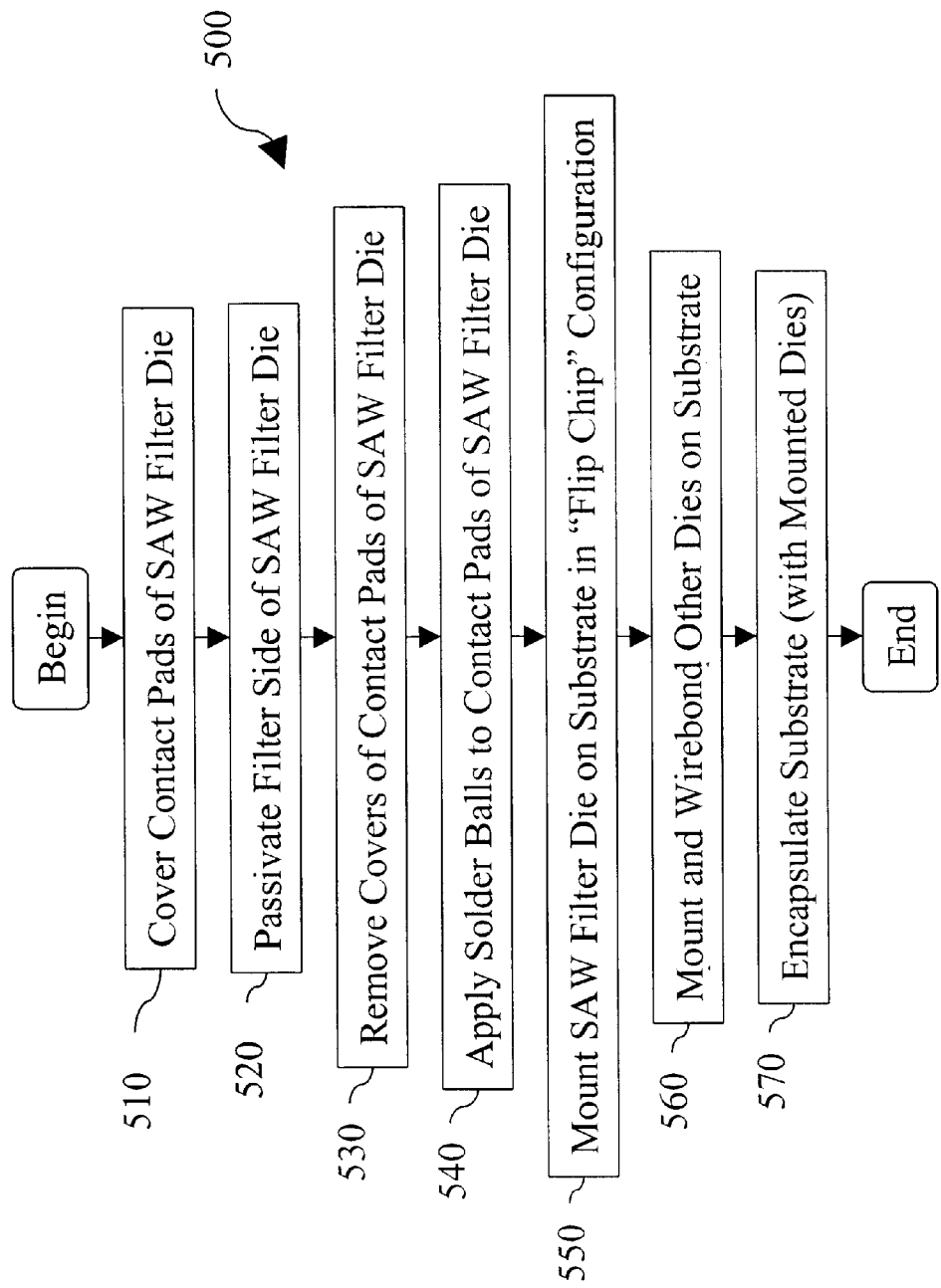

SURFACE ACOUSTIC WAVE FILTER PACKAGING

BACKGROUND

1. Technical Field

The present invention relates generally to electronic device packaging; and, more particularly, it relates to surface acoustic wave filter packaging on a multi-chip module.

2. Related Art

Traditional surface acoustic wave filters are available in relatively expensive ceramic packages. These ceramic packages are expensive not only in terms of initial cost, but they are expensive in terms of subsequent costs such as mounting and subsequent packaging and integration of them into larger scale devices. This relatively expensive purchase cost of conventional surface acoustic wave filters is mostly attributed to the relatively complex packaging of the surface acoustic wave filter that must be performed to ensure its proper performance once it is subsequently integrated into a device. Typically, the surface acoustic wave filter itself is fully enclosed in a ceramic package that itself contains contact pads such that the entire package is capable of being mounted on a substrate. The ceramic package contains, inside of the ceramic package, sufficient space so that the surface acoustic wave filter can properly propagate surface acoustic waves without obstruction. While the operation of these conventionally packaged surface acoustic wave filters is adequate, the cost of procuring them is often prohibitively high for their integration into certain low cost applications. In addition, even for some applications that have the overhead to accommodate their relatively high purchase price, the subsequently associated cost to incorporate them into a device is another cost barrier that must be overcome. These ceramic packages are typically hermetically sealed and surface mounted into their respective devices, and the handling of the relatively delicate ceramic packaging increases the cost of the overall integration of the device into which it is to be installed.

Absent the use of a surface acoustic wave filter that comes pre-packaged in a packaging such as the ceramic packaging described above, the surface acoustic wave filter is commonly incapable of being included into an end product that is to be encapsulated. This is because, using traditional packaging methods, the operation of the surface acoustic wave filter will be greatly compromised by the encapsulation process. This is largely due to the fact that after the encapsulation process has been performed, the surface acoustic waves are unable to propagate on the surface acoustic wave filter due to the obstruction of the material applied during the encapsulation process.

One major problem facing the incorporation of conventional surface acoustic wave filters is how to protect the surface of a surface acoustic wave filter such that it can operate properly even after encapsulation of the surface acoustic wave filter once it has been mounted into a device. Absent the use proper packaging of a surface acoustic wave filter using methods described above such as the ceramic packaging, the conventional art of including surface acoustic wave filters into devices does not permit their proper operation. In addition, the cost associated with their inclusion into many devices is often excessive and prohibitive of their incorporation into various devices. A method to incorporate such devices into so that the difficult cost margins are adequately met simply does not exist in the art. Also, the conventional manner in which surface acoustic wave filters are packaged, in ceramic, is inherently consumptive in real estate on a motherboard or other circuit board, in that, the surface acoustic wave filter requires a fixed amount of space on the board.

Further limitations and disadvantages of conventional and traditional systems will become apparent to one of skill in the art through comparison of such systems with the present invention as set forth in the remainder of the present application with reference to the drawings.

SUMMARY OF THE INVENTION

Various aspects of the present invention can be found in a wireless transceiver that receives a signal. The wireless transceiver contains a motherboard that itself contains an integrated substrate. On the integrated substrate are numerous circuitries and dies, namely, a switching circuitry, a surface acoustic wave (SAW) filter die, a low noise amplifier (LNA) die, and a mixer die, among other things. The signal that wireless transceiver receives is passed from the switching circuitry to the surface acoustic wave (SAW) filter die, then to the low noise amplifier (LNA) die, and then to the mixer die. From the mixer die, the signal is passed to other circuitry on the motherboard. The surface acoustic wave (SAW) filter die is mounted on the integrated substrate in a "flip chip" configuration in accordance with the present invention.

In certain embodiments of the invention, an antenna is used to receive the signal and pass it to the switching circuitry. The wireless transceiver is operable in a variety of different devices such as a wireless communication device or a cellular telephone. In some cases, the signal provided to the wireless transceiver is a speech signal.

The mounting of the surface acoustic wave (SAW) filter die on the integrated substrate in the "flip chip" configuration provides an air gap between the surface acoustic wave filter die and the integrated substrate. This air gap ensures proper operation of the surface acoustic wave filter. Also, if desired, a passivation layer composed of a dielectric material is deposited on the surface acoustic wave filter die prior to the surface acoustic wave filter die being mounted on the integrated substrate.

Other aspects of the present invention can be found in a multi-chip module having an integrated substrate and a surface acoustic wave (SAW) filter die. The surface acoustic wave (SAW) filter die is mounted in a "flip chip" configuration in accordance with the present invention and it is encapsulated on the integrated substrate.

Additional circuitry is included in the multi-chip module in various embodiments of the invention. For example, the surface acoustic wave filter die is itself contained within a flip mounted circuitry, and a surface mounted circuitry and a chip on-board circuitry are included in the multi-chip module. The surface mounted circuitry contains a switching circuitry, and the chip on-board circuitry contains a low noise amplifier die and a mixer die. Each of the flip mounted circuitry, the surface mounted circuitry, and the chip on-board circuitry is mounted on the integrated substrate. To perform the encapsulation of the surface acoustic wave (SAW) filter die on the integrated substrate, a molding compound is applied. The multi-chip module is operable in a number of electronic devices including a personal communication device. In addition, a passivation layer composed of a dielectric material is deposited on the surface acoustic wave filter die prior to the surface acoustic wave filter die being mounted on the integrated substrate in certain embodiments of the invention.

Other aspects of the present invention can be found in a method to package a surface acoustic wave filter die. The method includes, among other things, passivating a filter side of the surface acoustic wave filter die, then mounting the surface acoustic wave filter die in a flip chip configuration on a substrate, and then encapsulating the surface acoustic wave filter die on the substrate.

In certain embodiments of the invention, the method is performed such that a number of solder balls are applied to the various contacts pads of the surface acoustic wave (SAW) filter die before it is mounted in the flip chip configuration on the substrate. In addition, the various contacts pads on the surface acoustic wave (SAW) filter die are covered before the passivation is performed to the filter side of the surface acoustic wave filter die. The flip chip configuration provides for an air gap between the surface acoustic wave filter die and the substrate. If desired, a dielectric material is applied to the surface acoustic wave filter die to perform the passivation of the filter side of the surface acoustic wave filter die.

Other aspects, advantages and novel features of the present invention will become apparent from the following detailed description of the invention when considered in conjunction with the accompanying drawings.

BRIEF DESCRIPTION OF THE DRAWINGS

FIG. 5 is a functional block diagram illustrating another embodiment of a method performed in accordance with the present invention to package and mount a surface acoustic wave (SAW) filter die on a substrate.

DETAILED DESCRIPTION OF THE INVENTION

Figure 1:
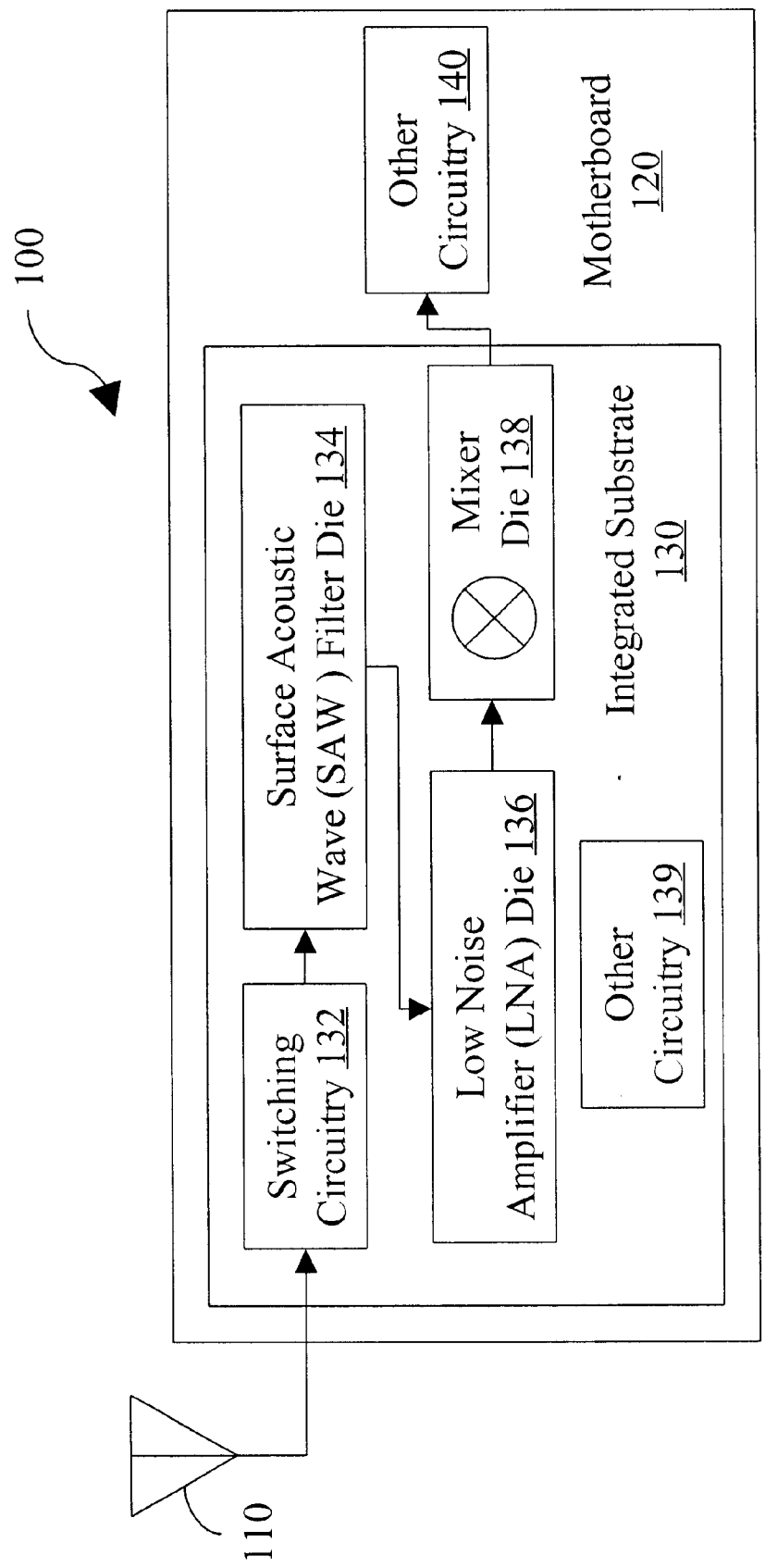
FIG. 1 is a system diagram illustrating one embodiment of a wireless transceiver built in accordance with the present invention.

FIG. 1 is a system diagram illustrating one embodiment of a wireless transceiver 100 built in accordance with the present invention. The wireless transceiver 100 shown in FIG. 1 is operable in a wide variety of devices, including, among other things, cellular telephones, personal radio communication devices, and other wireless electronic devices. The wireless transceiver 100 is provided a signal via an antenna 110. The antenna 110 provides the signal to a motherboard 120. The motherboard 120 itself contains, among other things, an integrated substrate 130 and any other circuitry 140. The integrated substrate 130 of the motherboard 120 is communicatively coupled to the any other circuitry 140. The any other circuitry 140 includes any number of various circuitries such as communication buses, modulators, demodulators, amplifiers, voltage controlled oscillators (VCOs), digitization circuitry, analog to digital converter circuitry, and other signal processing circuitry. The integrated circuitry 130 of the motherboard 120 employs, among other things, a switching circuitry 132, a surface acoustic wave (SAW) filter die 134, a low noise amplifier (LNA) die 136, and a mixer die 138, to process the signal that is provided from the antenna 110. In addition, the integrated substrate 130 contains any other circuitry 139 to perform various operations including and in addition to the processing of the signal provided via the antenna 110.

Similar to the any other circuitry 140 contained within the motherboard 120, yet outside of the integrated substrate 130 of the wireless transceiver 100, the any other circuitry 139 contained on the integrated substrate 130 is operable to perform a variety of functions. For example, the any other circuitry 139 performs any number of various functions such as power supply filtering, control signal filtering, impedance matching, signal modulating, and signal demodulating. In certain embodiments of the invention, the any other circuitry 139 is operable to augment and assist the operation of each of the switching circuitry 132, the surface acoustic wave (SAW) filter die 134, the low noise amplifier (LNA) die 136, and the mixer die 138. After the signal provided via the antenna 110 is first provided to the switching circuitry 132. It is then passed to the surface acoustic wave (SAW) filter die 134. After the signal has undergone filtering imposed by the surface acoustic wave (SAW) filter die 134, it is passed to the low noise amplifier (LNA) die 136. After undergoing any required switching, filtering, and amplification by each of the switching circuitry 132, the surface acoustic wave (SAW) filter die 134, and the low noise amplifier (LNA) die 136, respectively, the signal is passed to a mixer die 138. The mixer die 138 is the last die on the integrated substrate 130 in which the signal is down converted in frequency and passed to the remainder of the motherboard 120, and namely, to the any other circuitry 140.

As described above, the any other circuitry 140 is operable to perform a variety of functions for any of the various devices in which the wireless transceiver 100 is placed. The implementation of the integrated substrate 130 provides for a significant savings in terms of cost and real estate for the wireless transceiver 100. In addition, the integration of a number of dies on the single integrated substrate 130 provides for a reduction in size, cost, and weight for the wireless transceiver 100 that is extremely important for certain applications such as handheld wireless devices including cellular telephones, personal communication devices, and other wireless devices. For example, the wireless transceiver 100 is specifically operable in the Global System for Mobile Communications (GSM) industry standard for mobile handsets, among other industry standards.

Figure 2:
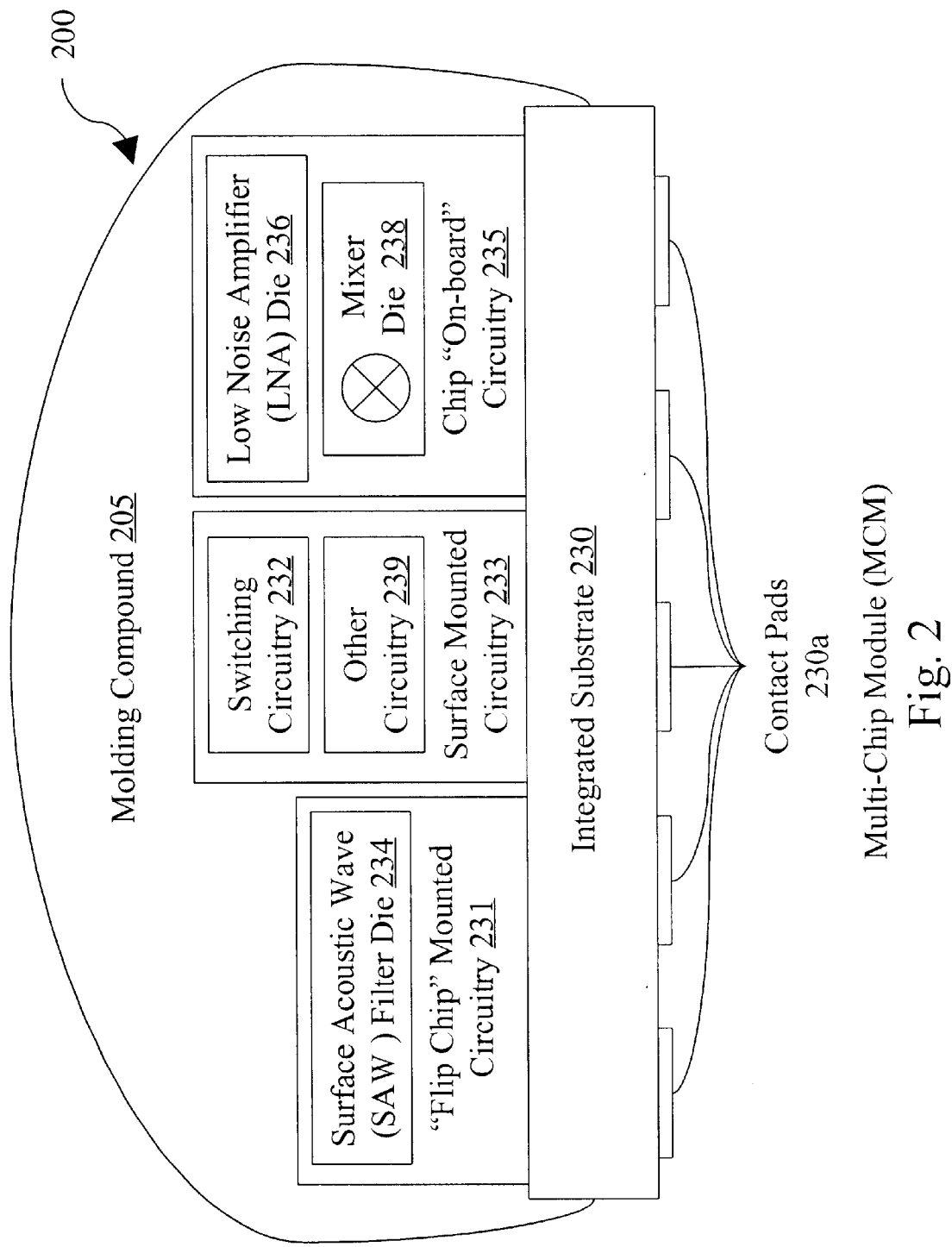
FIG. 2 is a system diagram illustrating one embodiment of a multi-chip module built in accordance with the present invention.

FIG. 2 is a system diagram illustrating one embodiment of a multi-chip module 200 built in accordance with the present invention. The multi-chip module 200 contains an integrated substrate 230 that itself has a number of contact pads 230a. The number of contact pads 230a enable the multi-chip module 200 to be mounted on a motherboard or other circuit board in various embodiments of the invention. On top of the integrated substrate 230 are a "flip chip" mounted circuitry 231, a surface mounted circuitry 233, and a chip "on-board" circuitry 235. After each of the "flip chip" mounted circuitry 231, the surface mounted circuitry 233, and the chip "on-board" circuitry 235 are mounted on the integrated substrate 230, a molding compound 205 is placed over them to encapsulate the integrated substrate 230. After the encapsulation of the integrated substrate 230 is performed, the multi-chip module 200 is capable of mounting on the motherboard or the other circuit board. The integrated substrate 230 is composed of any number of materials capable of serving as substrates within electronic devices, including BT, without departing from the scope and spirit of the invention.

The "flip chip" mounted circuitry 231 itself contains, among other things, a surface acoustic wave (SAW) filter die 234. The surface mounted circuitry 233 itself contains, among other things, a switching circuitry 232 and any other circuitry 239. The chip "on-board" circuitry 235 itself contains, among other things, a low noise amplifier (LNA) die 236 and a mixer die 238. In certain embodiments of the invention, the multi-chip module 200 is operable within the wireless transceiver 100 illustrated in FIG. 1. For example, the surface acoustic wave (SAW) filter die 234 contained within the "flip chip" mounted circuitry 231 is the surface acoustic wave (SAW) filter die 134 in such embodiments of the invention. Similarly, the switching circuitry 232 contained within the surface mounted circuitry 233 is the switching circuitry 132; the low noise amplifier (LNA) die 236 and the mixer die 238 contained within the chip "on-board" circuitry 235 are the low noise amplifier (LNA) die 136 a rid the mixer die 138, respectively, in such embodiments of the invention. The multi-chip module 200 is illustrative of the manner in which various circuitry are mounted on the integrated substrate 230 and encapsulated using the molding compound 205.

Figure 3:
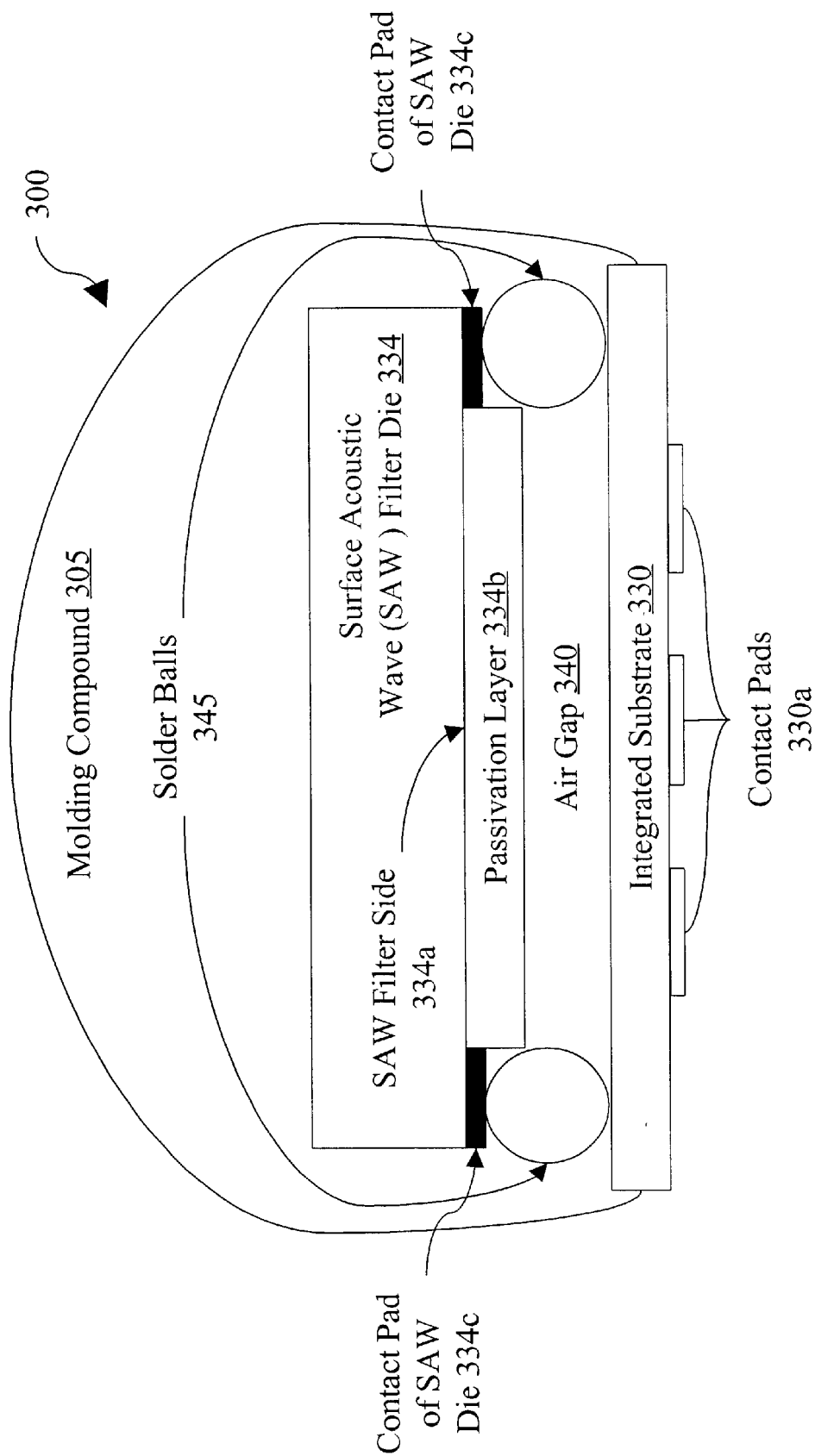
FIG. 3 is a system diagram illustrating one embodiment of a "flip chip" mounted circuitry built in accordance with the present invention.

FIG. 3 is a system diagram illustrating one embodiment of a "flip chip" mounted circuitry 300 built in accordance with the present invention. The "flip chip" mounted circuitry 300 is a detailed view of one embodiment of the "flip chip" mounted circuitry 231 shown in FIG. 2. The "flip chip" mounted circuitry 300 contains an integrated substrate 330 that itself has a number of contact pads 330a to enable the integrated substrate 330 to be mounted on a motherboard or other circuit board. A surface acoustic wave (SAW) filter die 334 is mounted on the integrated substrate 330. The surface acoustic wave (SAW) filter die 334 itself has a number of contact pads 334c to enable the surface acoustic wave (SAW) filter die to be mounted on the integrated substrate 330. Also, in the specific embodiment illustrated in FIG. 3, the surface acoustic wave (SAW) filter die 334 has a surface acoustic wave (SAW) filter side 334a. The surface acoustic wave (SAW) filter die 334 is mounted on the motherboard or other circuit board such that the surface acoustic wave (SAW) filter side 334a is facing the integrated substrate 330. From one perspective, it is the surface acoustic wave (SAW) filter die 334 that is mounted in a "flip chip" configuration in FIG. 3.

However, before the surface acoustic wave (SAW) filter die 334 is mounted on the motherboard of other circuit board, the surface acoustic wave (SAW) filter die 334 is prepared for the mounting using various methods of preparation. One manner in which the surface acoustic wave (SAW) filter die 334 is prepared for mounting is by depositing a passivation layer 334b on the surface acoustic wave (SAW) filter side 334a of the surface acoustic wave (SAW) filter die 334. Any method known in the art for depositing the passivation layer 334b is employed without departing from the scope and spirit of the invention. In addition, any number of various dielectric materials are used for the passivation layer 334b including, but not limited to, silicon dioxide ($SiO_2$) and titanium nitride (TiN). The deposition of the dielectric material as the passivation layer 334b on the surface acoustic wave (SAW) filter side 334a of the surface acoustic wave (SAW) filter die 334 does not interfere with the operation of the surface acoustic wave (SAW) filter die 334. That is to say, the dielectric coating that constitutes the passivation layer 334b does not prohibit the propagation of surface acoustic waves within the surface acoustic wave (SAW) filter die 334.

Before the passivation layer 334b is deposited, the number of contact pads 334c of the surface acoustic wave (SAW) filter side 334 are covered, so that those contact pads 334c are not passivated and thereby made ineffectual for communicatively coupling of various electrical signals. In addition, a number of solder balls 345 are placed on the contact pads 334c of the surface acoustic wave (SAW) filter die 334 before the surface acoustic wave (SAW) filter die 334 is placed on the integrated substrate 330. The particular size of the solder balls 345 is chosen appropriately such that, when the surface acoustic wave (SAW) filter die 334 is actually mounted on the integrated substrate 330, an air gap 340 is maintained between the passivation layer 334b of the surface acoustic wave (SAW) filter die 334 and the integrated substrate 330. The solder balls 345 that are applied to the contact pads 334c are re-flowed once the surface acoustic wave (SAW) filter die 334 is mounted on the integrated substrate 330, thereby ensuring sufficient electrical conductivity between the number of contact pads 334c of the surface acoustic wave (SAW) filter die 334 and the integrated substrate 330. After the surface acoustic wave (SAW) filter die 334 has been mounted on the integrated substrate 330 in the proper "flip chip" configuration described above, a molding compound 305 is applied over the top of the integrated substrate 330 and the "flip chip" mounted circuitry 300 contained thereon. The molding compound 305 serves as a protector of the "flip chip" mounted circuitry 300 shown in FIG. 3, similar to the function provided by the molding compound 205 in FIG. 2 that protects the various circuitires within the multi-chip module 200.

The air gap 340 enables the surface acoustic wave filter of the surface acoustic wave (SAW) filter die 334 to function properly. Borrowing on the inherent "flip chip" mounting configuration of the surface acoustic wave (SAW) filter die 334, as well as the air gap 340 that is ensured via the implementation of the solder balls 345, the surface acoustic wave filter of the surface acoustic wave (SAW) filter die 334 is amenable for unobstructed operation. As mentioned above, the passivation layer 334b does not obstruct the proper operation of the surface acoustic wave (SAW) filter die 334, yet the passivation layer 334b does provide a degree of protection to the surface acoustic wave (SAW) filter side 334a from undesirable perturbations that potentially diminish the optimal operation of the surface acoustic wave filter of the surface acoustic wave (SAW) filter die 334. One example of such an undesirable perturbation is humidity that makes its way through the integrated substrate 330 in environmentally rugged environments.

When the "flip chip" mounted circuitry 300 is contained within certain devices described above in various embodiments of the invention, such as handheld wireless devices such as personal communication devices, a user may take the device from a relatively warm environment (say inside of an airport) to a relatively cool environment (say outside of the airport, and condensation and humidity potentially accumulates within the device. For such an instance, the passivation layer 334b ensures protection of the surface acoustic wave (SAW) filter die 334 so that it continues to operate properly even in the event of dynamic environmental perturbations such as humidity and temperature variations.

Figure 4:
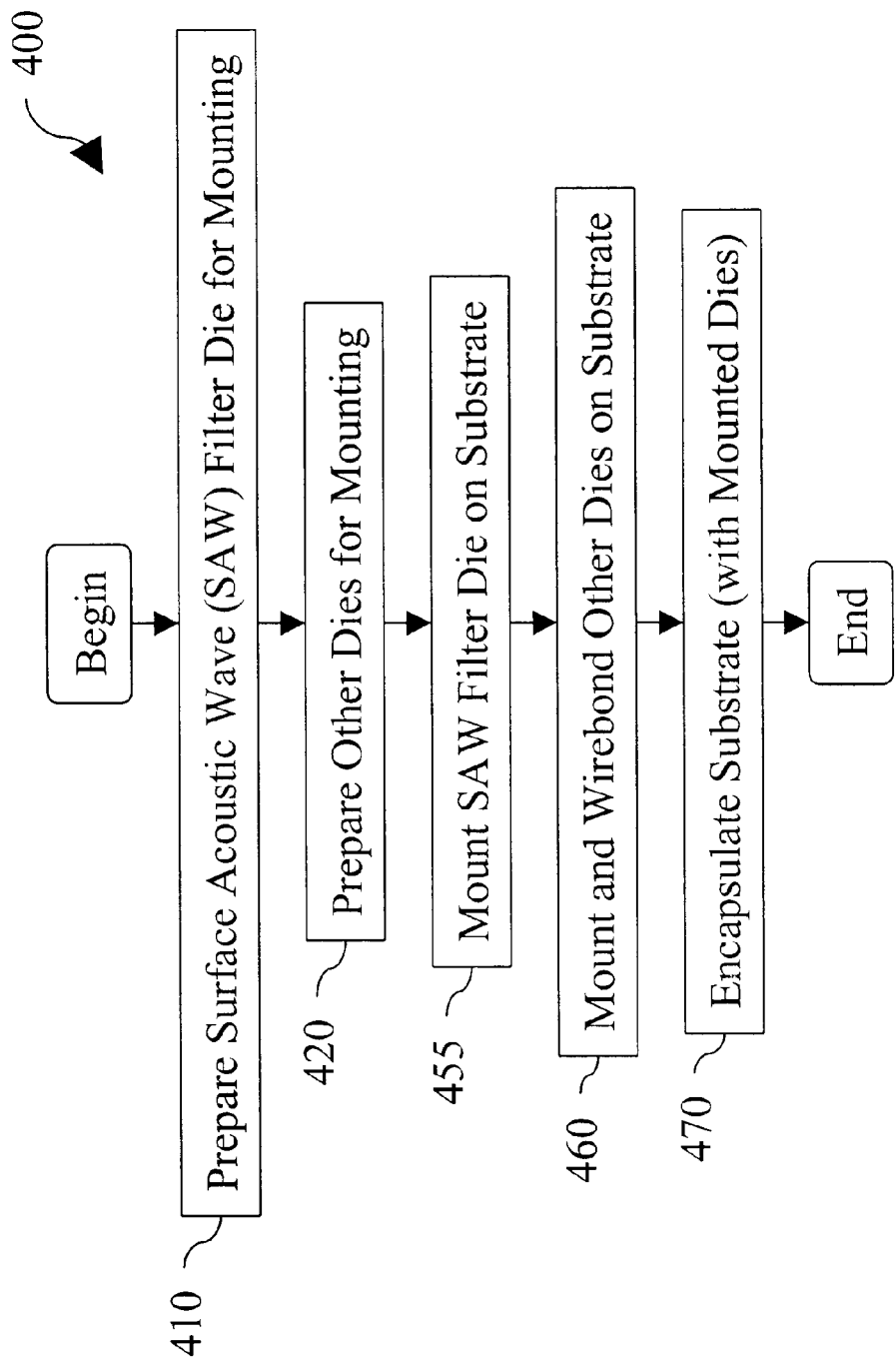
FIG. 4 is a functional block diagram illustrating one embodiment of a method performed in accordance with the present invention to package and mount a surface acoustic wave (SAW) filter die on a substrate.

FIG. 4 is a functional block diagram illustrating one embodiment of a method 400 performed in accordance with the present invention to package and mount a surface acoustic wave (SAW) filter die on a substrate. Initially, in a block 410, a surface acoustic wave (SAW) filter die is prepared for mounting. In various embodiments of the invention, this preparation of the surface acoustic wave (SAW) filter die includes any number of methods of preparation in accordance with the present invention. For example, in certain embodiments of the invention, this preparation in the block 410 includes laying a passivation layer similar to the passivation layer 334b described in the "flip chip" mounted circuitry 300 of FIG. 3.

Subsequently, any other dies that are to be mounted are prepared in a block 420. As shown above in various embodiments of the invention, this preparation is limited simply to the physical mounting of the various other dies in certain cases to more extensive preparation for other dies. For example, in some cases, the preparation includes the preparation of the surface mounted circuitry 233 of FIG. 2. In other instances, it includes the preparation of the chip "on-board" circuitry 235. Other means of preparation are envisioned within the scope and spirit of the invention. Then, in a block 455, the surface acoustic wave (SAW) filter die is actually mounted on a substrate. This mounting is performed in any of the various embodiments of the invention described in the Figures above. Subsequently, the other dies that have been prepared for mounting in the block 420, are actually mounted and wirebonded on the substrate in a block 460. Once all of the dies, including the surface acoustic wave (SAW) filter die and any other dies are mounted on the substrate, the substrate itself is encapsulated in a block 470. The method 400 is viewed, from certain perspectives, as a method wherein a surface acoustic wave (SAW) filter die and any other dies are prepared for mounting and then the surface acoustic wave (SAW) filter die and the other dies are actually mounted on a substrate.

FIG. 5 is a functional block diagram illustrating another embodiment of a method 500 performed in accordance with the present invention to package and mount a surface acoustic wave (SAW) filter die on a substrate. First, to perform preparation of the surface acoustic wave (SAW) filter die, the contact pads of the surface acoustic wave (SAW) filter die are covered in a block 510. Subsequently, once the contact pads of the surface acoustic wave (SAW) filter die are covered in the block 510, a passivation layer is applied to the surface acoustic wave (SAW) filter die in a block 520. The passivation layer is applied to the filter side of the surface acoustic wave (SAW) filter die in the block 520. After the passivation layer has been deposited on the substrate, the covers for the contact pads are removed from the substrate in a block 530. At this point, the passivation layer has been applied to the entirety of the filter side of the surface acoustic wave (SAW) filter die, except for the portion of the filter side of the surface acoustic wave (SAW) filter die having the contact pads. The integrity of the contact pads is ensured to maintain their capability of providing a sound electrical contact to the substrate when the surface acoustic wave (SAW) filter die is actually mounted on the substrate.

However, before performing the mounting of the surface acoustic wave (SAW) filter die on the substrate, solder balls are applied to the contact pads of the surface acoustic wave (SAW) filter die in a block 540. The size of these solder balls is such that after the surface acoustic wave (SAW) filter die is mounted on the substrate, and after the solder balls are let flow to allow the electrical conductivity of the surface acoustic wave (SAW) filter die itself to the substrate, an air gap is maintained between the filter side of the surface acoustic wave (SAW) filter die and the passivation layer of the substrate. In order to maintain this particular configuration, the surface acoustic wave (SAW) filter die is mounted on the substrate in a "flip chip" configuration in a block 550. That is to say, the filter side of the surface acoustic wave (SAW) filter die, namely, the passivation layer of the filter side of the surface acoustic wave (SAW) filter die, is mounted such that it is facing the substrate. Subsequently, any other dies that are to be mounted on the substrate are mounted and wirebonded in a block 560. After all of the dies have been mounted on the substrate, including the surface acoustic wave (SAW) filter die, the entirety of the substrate is encapsulated in a block 570.

In view of the above detailed description of the present invention and associated drawings, other modifications and variations will now become apparent to those skilled in the art. It should also be apparent that such other modifications and variations may be effected without departing from the spirit and scope of the present invention.

What is claimed is:

1. A wireless transceiver that receives a signal, the wireless transceiver comprising:
a motherboard;
an integrated substrate that is mounted on the motherboard;
a switching circuitry that receives the signal;
a surface acoustic wave filter die that receives the signal from the switching circuitry and that filters the signal;
a low noise amplifier die that receives the signal from the surface acoustic wave filter die and that amplifies the signal; and a mixer die that receives the signal from the low noise amplifier die and that downconverts a frequency of the signal, wherein each of the switching circuitry, the surface acoustic wave filter die, the low noise amplifier die, and the mixer die is mounted on the integrated substrate; and the surface acoustic wave filter die is mounted in a flip chip configuration on the integrated substrate, and a passivation layer is deposited on the surface acoustic wave filter die prior to the surface acoustic wave filter die being mounted on the integrated substrate.

2. The wireless transceiver of claim 1, further comprising an antenna that receives the signal and provides the signal to the switching circuitry.

3. The wireless transceiver of claim 1, further comprising at least one additional circuitry, the at least one additional circuitry is mounted on the motherboard and the at least one additional circuitry receives the signal from the mixer die.

4. The wireless transceiver of claim 1, wherein the wireless transceiver is a wireless communication device.

5. The wireless transceiver of claim 1, wherein the wireless transceiver is a cellular telephone.

6. The wireless transceiver of claim 1, wherein the signal is a speech signal.

7. The wireless transceiver of claim 1, wherein the flip chip configuration of mounting of the surface acoustic wave filter die on the integrated substrate provides an air gap between the surface acoustic wave filter die and the integrated substrate.

8. The wireless transceiver of claim 1, wherein the passivation layer is a dielectric material.

9. The wireless transceiver of claim 1 wherein the passivation layer covers the surface acoustic wave filter die active region.

10. A multi-chip module comprising: an integrated substrate; a surface acoustic wave filter die that is mounted on the integrated substrate, surface acoustic wave filter die is mounted in a flip chip configuration on the integrated substrate, the surface acoustic wave filter die is encapsulated on the integrated substrate; and wherein a passivation layer is deposited on the surface acoustic wave filter die prior to the surface acoustic wave filter die being mounted on the integrated substrate, wherein the surface acoustic wave filter die is contained within a flip mounted circuitry; and further comprising a surface mounted circuitry, the surface mounted circuitry comprises a switching circuitry; and a chip on-board circuitry, the chip on-board circuitry comprises a low noise amplifier die and a mixer die; and wherein each of the flip mounted circuitry, the surface mounted circuitry, and the chip on-board circuitry is mounted on the integrated substrate.

11. The multi-chip module of claim 10, wherein a molding compound encapsulated the surface acoustic wave filter die on the integrated substrate.

12. The multi-chip module of claim 10, wherein the multi-chip module is contained within a personal communication device.

13. The multi-chip module of claim 10, wherein the passivation layer is a dielectric material.

14. A method to package a surface acoustic wave (SAW) filter die, the method comprising: passivating a filter side of the surface acoustic wave filter die; mounting the surface acoustic wave filter die in a flip chip configuration on a substrate; and encapsulating the surface acoustic wave filter die on the substrate, wherein the surface acoustic wave filter die comprises a plurality of contact pads; and further comprising applying a plurality of solder balls to the plurality of contacts pads before mounting the surface acoustic wave filter die in the flip chip configuration on the substrate, wherein the passivating the filter side of the surface acoustic wave filter die covers the surface acoustic wave filter active region.

15. The method of claim 14, further comprising covering the plurality of contact pads before passivating the filter side of the surface acoustic wave filter die.

16. The method of claim 14, wherein the flip chip configuration provides an air gap between the surface acoustic wave filter die and the substrate.

17. The method of claim 14, wherein a dielectric material is applied to the surface acoustic wave filter die to perform the passivation of the filter side of the surface acoustic wave filter die.

* * * * *